United States Patent
Wang et al.

(10) Patent No.: US 10,536,069 B2
(45) Date of Patent: Jan. 14, 2020

(54) VIRTUAL RESISTANCE GATE DRIVER

(71) Applicant: FORD GLOBAL TECHNOLOGIES, LLC, Dearborn, MI (US)

(72) Inventors: Jiyao Wang, Canton, MI (US); Wei Xu, Canton, MI (US); Silong Li, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/009,666

(22) Filed: Jun. 15, 2018

(65) Prior Publication Data

US 2019/0386557 A1 Dec. 19, 2019

(51) Int. Cl.
| | |
|---|---|
| *H02P 1/00* | (2006.01) |
| *H02M 1/08* | (2006.01) |
| *H02P 27/08* | (2006.01) |
| *H02P 29/50* | (2016.01) |
| *H02M 1/12* | (2006.01) |
| *H02M 7/5387* | (2007.01) |
| *H02M 1/00* | (2006.01) |
| *B60L 50/51* | (2019.01) |

(52) U.S. Cl.
CPC ............... *H02M 1/08* (2013.01); *H02M 1/12* (2013.01); *H02M 7/53871* (2013.01); *H02P 27/085* (2013.01); *H02P 29/50* (2016.02); *B60L 50/51* (2019.02); *B60L 2210/40* (2013.01); *H02M 2001/0048* (2013.01)

(58) Field of Classification Search
CPC ............ H02P 6/06; H02P 6/17; H02M 7/5395
See application file for complete search history.

(56) References Cited

U.S. PATENT DOCUMENTS

| | | | | |
|---|---|---|---|---|
| 5,563,980 A | * | 10/1996 | Chen | ......................... H02P 6/06 318/609 |
| 5,606,490 A | * | 2/1997 | Hong | ..................... H02H 3/093 323/908 |
| 2015/0381031 A1 | * | 12/2015 | Ghosh | ..................... H02M 1/34 363/21.12 |
| 2017/0149350 A1 | | 5/2017 | Ramamurthy et al. | |

OTHER PUBLICATIONS

Al-Nussairi et al., "Constant Power Loads (CPL) with Microgrids: Problem Definition, Stability Analysis and Compensation Techniques," Energies 2017, 10(10), 1656; https://doi.org/10.3390/en10101656.
Zhou, Xiaohu, "Design and Control of Bi-Directional Grid-Interactive Converter for Plug-in Hybrid Electric Vehicle Applications," NCSU Library, Dissertations, Aug. 12, 2011, http://www.lib.ncsu.edu/resolver/1840.16/7350.

\* cited by examiner

*Primary Examiner* — Karen Masih
(74) *Attorney, Agent, or Firm* — David B. Kelley; Brooks Kushman P.C.

(57) ABSTRACT

A vehicle includes an electric machine operated by an inverter. The electric machine includes a gate driver configured to energize a switch of the inverter with a pulse width modulation (PWM) signal. The gate driver is configured to delay the PWM signal by a dependent amount that is a function of a magnitude of current of a lead of the electric machine. The delay is responsive to a polarity of the current being positive.

20 Claims, 6 Drawing Sheets

VIRTUAL RESISTANCE GATE DRIVER

TECHNICAL FIELD

The present disclosure relates to a gate driver generated virtual resistance.

BACKGROUND

Damping methods are used to reduce harmonic distortion at resonant frequencies of an inverter. Passive and active damping methods may be used. Although passive methods provide adequate damping, resistive losses reduce efficiency. Software-based virtual resistors have been implemented to reduce hardware losses. Such software-based virtual resistors defined and generated by a controller may overburden the controller and reduce performance.

SUMMARY

A vehicle includes an electric machine operated by an inverter. The electric machine includes a gate driver configured to energize a switch of the inverter with a pulse width modulation (PWM) signal. The gate driver is configured to delay the PWM signal by a dependent amount that is a function of a magnitude of current of a lead of the electric machine. The delay is responsive to a polarity of the current being positive.

A vehicle includes an electric machine operated by an inverter. The electric machine includes a gate driver configured to energize a switch of the inverter with a pulse width modulation (PWM) signal. The gate driver is configured to delay the PWM signal by an independent amount that is independent of a magnitude of current of a lead of the electric machine. The delay is responsive to a polarity of the current being negative.

A vehicle includes an electric machine operated by an inverter. The electric machine includes a gate driver configured to energize a switch of the inverter with a pulse width modulation (PWM) signal. The gate driver is configured to delay the PWM signal by a dependent amount that is a function of a magnitude of the current through a corresponding switch. The delay is responsive to a polarity of the current being positive and a polarity of current through a corresponding switch being negative.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A solution may be implemented to provide a virtual damping resistor for an inverter system at the gate driver. Gate drivers energize the gates of switches of the inverter. The switches of the inverter may be insulated-gate bipolar transistors (IGBT). The gate drivers may energize the switches based on a PWM signal from a microcontroller. The gate driver may modulate the PWM signal to impart the characteristics of a virtual damping resistor. The virtual resistor may require modulation of the width of the PWM pulses. In order to modulate pulses of the PWM signal the input PWM signal may be delayed. The delay of the PWM signal allows modulation of the PWM pulses to widths that would otherwise be unavailable because the desired modulation period has already occurred. For example, if the virtual resistor required a wider pulse width than is otherwise provided to the gate driver, the gate driver has no way to post-hoc extend the pulse. Therefore, the input PWM signal is delayed by a predetermined constant. Modulations to the PWM signal that would otherwise be post-hoc are delayed less such that the PWM signal is modulated to generate a virtual resistor. Indeed, a hardware implemented virtual resistor can be realized through the gate driver via a delayed modulation of the PWM.

Figure 1:
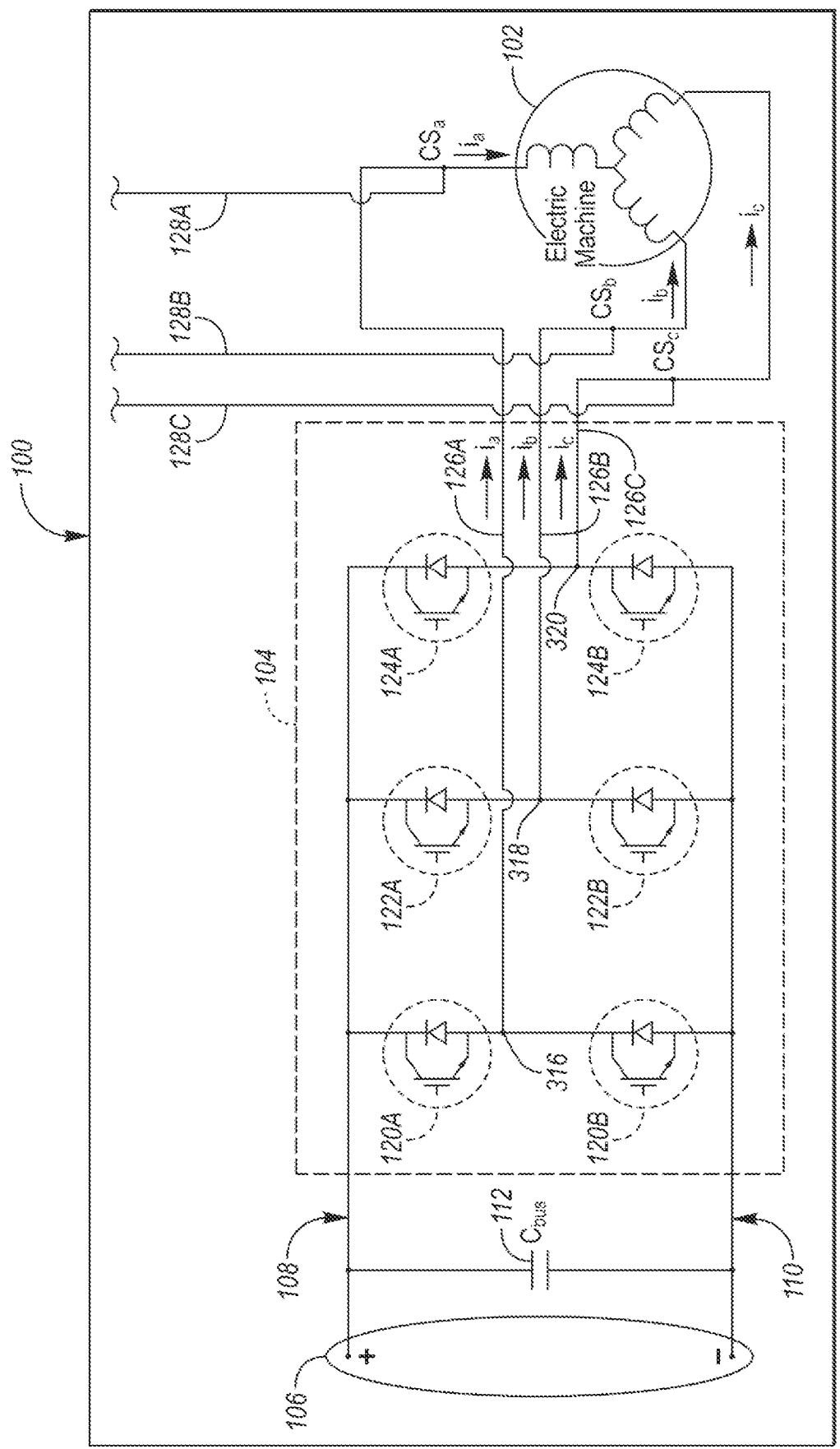
FIG. 1 is a schematic of a vehicle having an electric machine and inverter.

Referring to FIG. 1, a vehicle 100 is shown. The vehicle 100 includes an electric machine 102. Although shown as a Wye configuration, a Delta configuration may also be used. The electric machine 102 is operated by an inverter 104. The inverter 104 converts direct current (DC) from the battery 106 to alternating current (AC) for the electric machine 102 and vice-versa. The battery powers rails 108, 110 of the inverter. The capacitor 112 removes voltage fluctuation. The switches 120A, 120B, 122A, 122B, 124A, 124B operate to convert DC to AC and energize leads 126A, 126B, 126C of the electric machine 102. Current on the leads 126A, 126B, 126C may be monitored via current sensors 128A, 128B, 128C. The switches 120A, 120B, 122A, 122B, 124A, 124B may also include internal current sensing capabilities (not shown) to monitor current through the switches 120A, 120B, 122A, 122B, 124A, 124B.

Figure 2A:
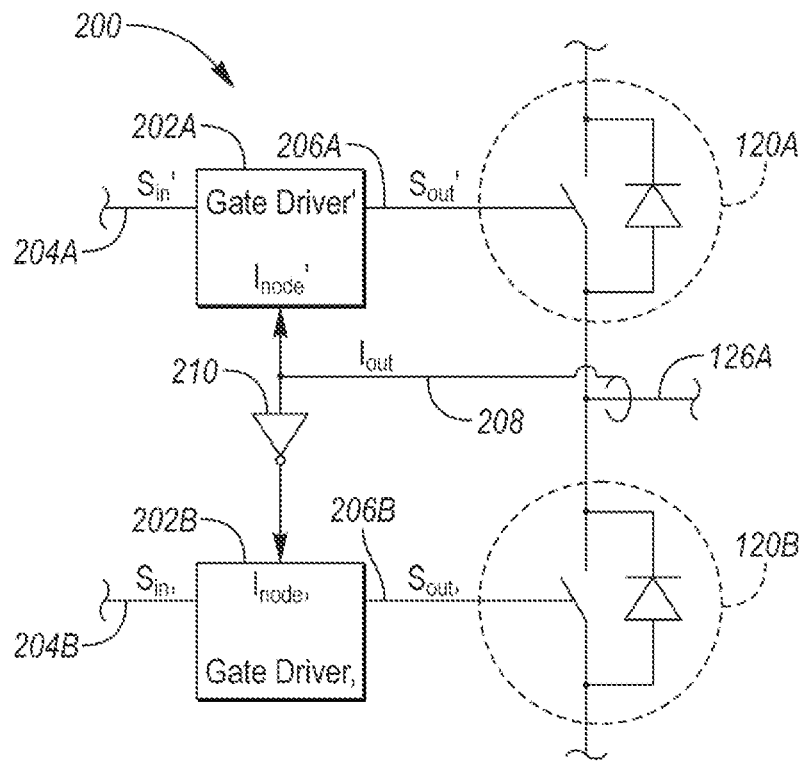
FIG. 2A is a schematic of corresponding switches associated with a phase of the electric machine and associated gate drivers having electric machine lead feedback.

Referring to FIG. 2A, a set of corresponding switches 120A, 120B is shown where lead 126A feedback 208 is available. Corresponding switches 120A, 120B cooperatively energize the lead 126A of the electric machine 102. Each of the switches 120A, 120B are operated by gate drivers 202A, 202B, respectively. The gate drivers 202A, 202B receive input PWM signals 204A, 204B and output PWM signals 206A, 206B, respectively. The input PWM signals 204A, 204B may be received from a microcontroller (not shown) configured to create the PWM signal. The output PWM signals 206A, 206B are delayed, as discussed below. The gate drivers 202A, 202B receive current feedback 208. Although gate drivers 202A, 202B are configured similarly, the current feedback to the negative switch 120B is reversed in polarity by negative logic 210 to ensure the output PWM signal 206B corresponds with output PWM signal 206A, ensuring a cooperative AC signal on the lead 126A.

Figure 2B:
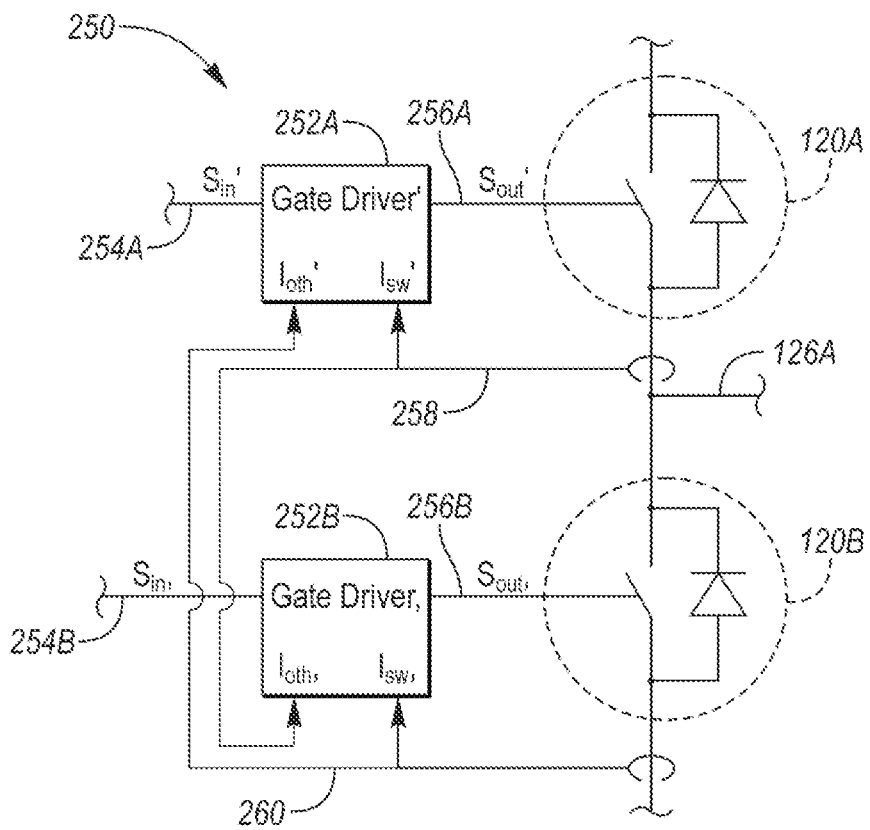
FIG. 2B is a schematic of corresponding switches associated with a phase of the electric machine and associated gate drivers having internal switch feedback.

Referring to FIG. 2B, a set of corresponding switches 120A, 120B is shown where lead 126A feedback is unavailable. Corresponding switches 120A, 120B cooperatively energize the lead 126A of the electric machine 102. Each of the switches 120A, 120B are operated by gate drivers 252A, 252B, respectively. The gate drivers 252A, 252B receive input PWM signals 254A, 254B and output PWM signals 256A, 256B, respectively. The input PWM signals 254A, 254B may be received from a microcontroller (not shown) configured to create the PWM signal. The output PWM signals 256A, 256B are delayed, as discussed below. The gate drivers 252A, 252B receive current feedback from respective switches 120A, 120B and the corresponding switches 120A, 120b. For example, gate driver 252A receives current feedback 258 associated with the switch 120A it provides the output PWM signal 256A. Gate driver 252A also receives current feedback 260 from the corresponding switch 120B. As shown below, the current feedback 258, 260 is used to delay the PWM signal at gate drivers 252A, 252B. The switches 120A and 120B may provide current feedback 258, 260 through a shunt or other implement to provide a current indication. The current 258, 260 may correspond with a voltage across terminal of the switches 120A, 120B. Because the gate drivers 252A, 252B receive current feedback 258, 260 from both switches 120A, 120B, inversion of the current feedback is not necessary.

Figure 3A:
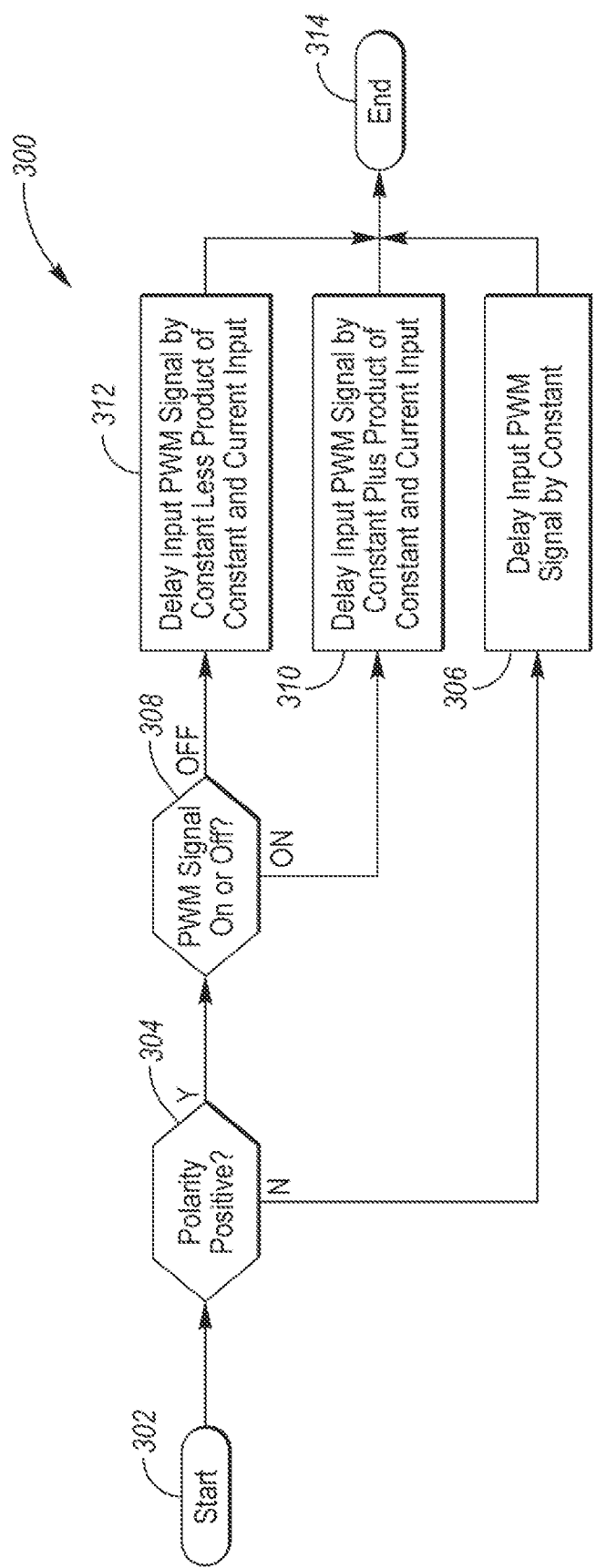
FIG. 3A is an algorithm for delaying a PWM signal via a gate driver having electric machine lead feedback.

Referring to FIG. 3A, an algorithm 300 is shown. The algorithm is embodied, via hardware or software, in the gate drivers 202A, 202B. The algorithm 300 beings in step 302. In step 304, the gate drivers 202A, 202B detect the polarity of the current feedback 208. If the current feedback is negative in step 304, the input PWM signal is delayed by a constant in step 306. The constant may be greater than an energization or minimum switching period of the switches. The switching period may be 1.0 µs. The constant may be 1.5 µs. If the polarity is positive in step 304, the gate drivers 202A, 202B determine the active state of the PWM signal in step 308. If the PWM signal is ON then the input signal is delayed by the constant discussed above plus the product of the constant and the current input in step 310. In step 312, if the PWM signal is OFF in step 308, the input PWM signal is delayed by a constant less the product of the constant and the current input. It should be appreciated that the constant may be scaled or two constants may be used in order to achieve the appropriate delay. Meaning, the constants and the current input may be tuned by a gain to ensure that the virtual resistor PWM signal is obtained. The first constant may be configured as 1.5 µs, and the second constant may be configured as 1.5 µs per 100 amps. The virtual resistor value may be determined by Equation 1, $$Rv = \frac{\Delta V}{Iout} = \frac{V_{dc} \cdot 2\Delta TA \cdot Iout}{Ts \cdot Iout} = \frac{V_{dc} \cdot 2\Delta TA}{Ts}, \quad (1)$$

where $V_{dc}$ is the bus voltage (400 V), $\Delta TA$ is 1.5 µs per 100 amps, and $T_S$ is 100 µs such that the delay varies cycle-by-cycle according to the current flowing through the switch imparting a virtual resistor and harmonic damping.

Figure 3B:
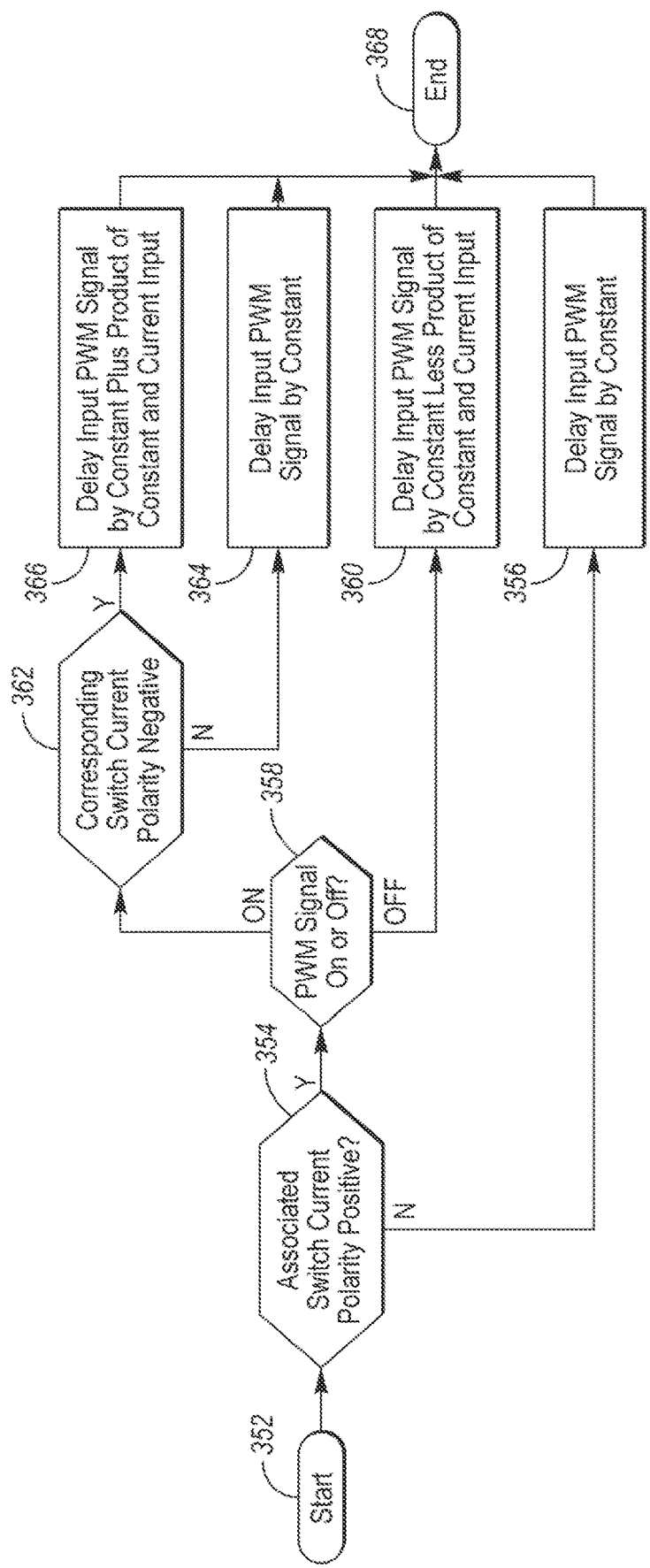
FIG. 3B is an algorithm for delaying a PWM signal via a gate driver having internal switch feedback.

Referring to FIG. 3B, an algorithm 350 is shown. The algorithm is embodied, via hardware or software, in the gate drivers 252A, 252B. The algorithm 350 beings in step 352. In step 354, the gate drivers 252A, 252B detect the polarity of the associated current feedback 258. If the current feedback is negative in step 354, the input PWM signal is delayed by a constant in step 356. The constant may be greater than an energization or minimum switching period of the switches. The constant may be 1.5 µs. If the polarity is positive in step 354, the gate drivers 252A, 252B determine the active state of the PWM signal in step 358. In step 360, if the PWM signal is OFF in step 358, the input PWM signal is delayed by a constant less the product of the constant and the current input. If the PWM signal is ON in step 358, the gate drivers 252A, 252B delay the PWM signal based on the corresponding gate drivers current. Meaning, if the corresponding gate drivers current is negative the input PWM signal is delayed by a constant plus a product of the constant and the corresponding gate drivers current in step 366. Therefore, gate driver 252A will first look at its own current feedback 258, if the PWM signal is on, the gate driver 252A will next look at the corresponding gate driver's 252B current feedback 260 to determine whether to delay by a constant or a constant plus the product. It should be appreciated, as above, that the constant may be scaled or two constants may be used in order to achieve the appropriate delay. Meaning, the constants and the current input may be tuned by a gain to ensure that the virtual resistor PWM signal is obtained. The first constant may be configured as 1.5 µs, and the second constant may be configured as 1.5 µs per 100 amps.

Figure 4:
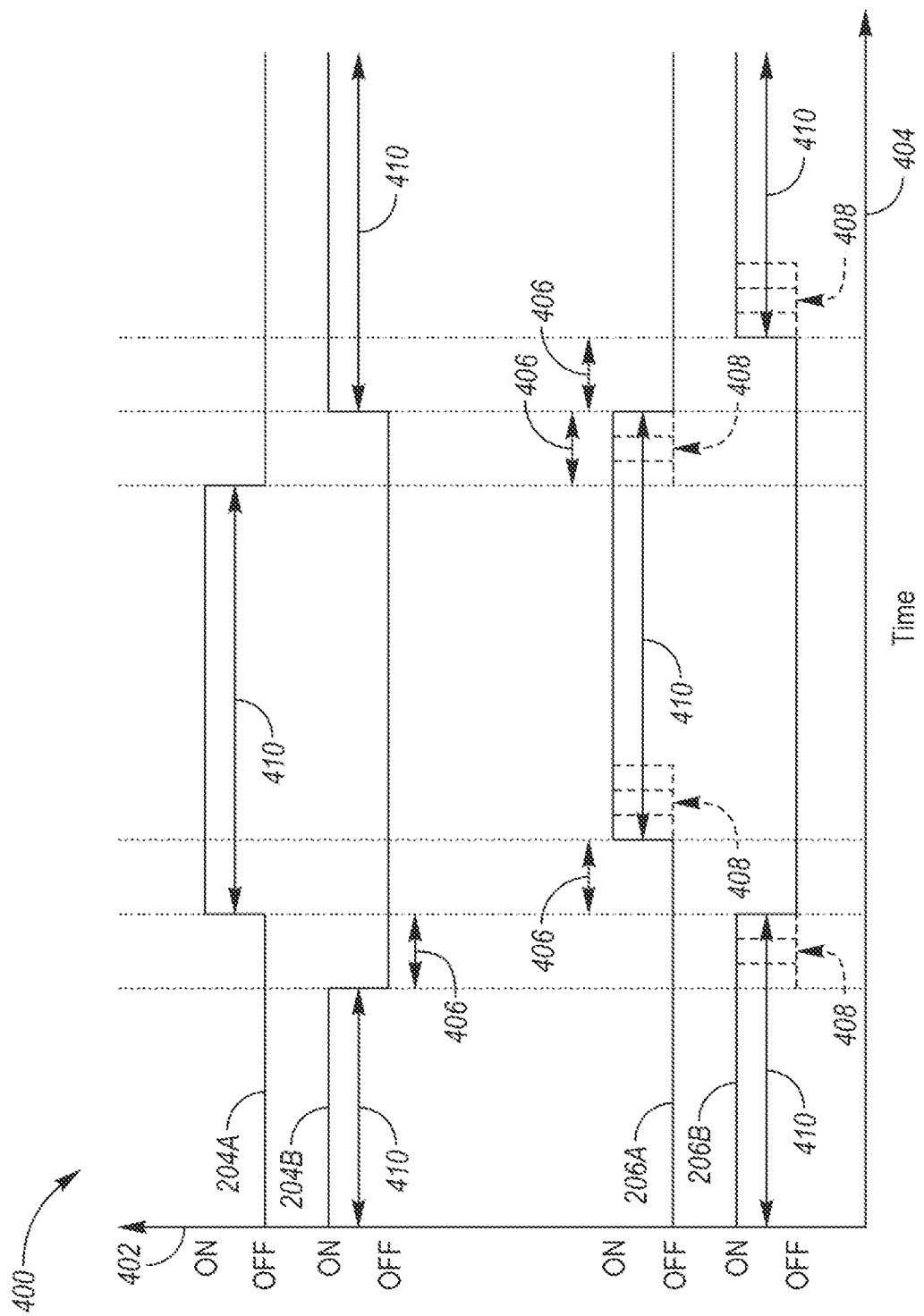
FIG. 4 is a graph depicting a PWM signal delay based on current.

Referring to FIG. 4, a graph 400 is shown having x-axis 404 in time and y-axis 402 indicating the state of the PWM signals. The input PWM signals 204A, 204B are shown with corresponding output PWM signals 206A, 206B from the gate drivers 202A, 202B. It should be appreciated that the gate drivers 252A, 252B operate similarly. A delay 406 is imparted into the output PWM signals 206A, 206B of varying lengths 408. The delay 406 of the PWM signals 204A, 204B allows modulation of the PWM pulses to widths 410 that would otherwise be unavailable because the desired modulation period has already occurred. For example, if the virtual resistor required a wider pulse width 410 than is otherwise provided to the gate driver, the gate driver has no way to post-hoc extend the pulse. Therefore, the input PWM signals 204A, 204B are delayed a predetermined constant 406 plus or less a variance 408.

Figure 5A:
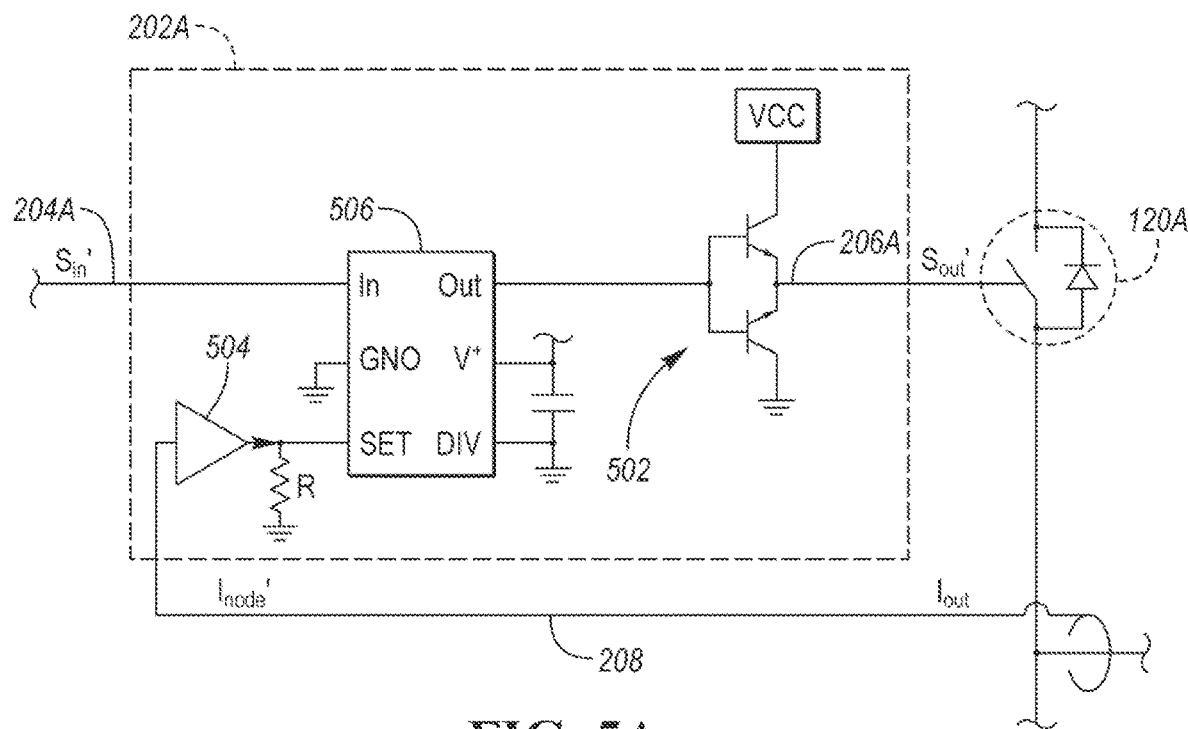
FIG. 5A is a schematic of a gate driver circuit having electric machine lead feedback.

Referring to FIG. 5A, a schematic of a delay gate driver 202A is shown. Other gate drivers 202b, 252A, 252B may be similarly configured. The gate driver 202A receives an input PWM signal 204A. The gate driver 202A outputs a PWM signal 206A. The output PWM signal 206A drives the switch 120A. The gate driver 202A includes a driver circuit 502 and a delay circuit 506. The input to the delay circuit 506 includes a gain adjustment circuit 504 to ensure the proper delay is created by the gate driver 202A. The gain adjustment circuit 504 is fed by the current feedback 208. The delay circuit 506 may be an integrated circuit as is known in the art.

Figure 5B:
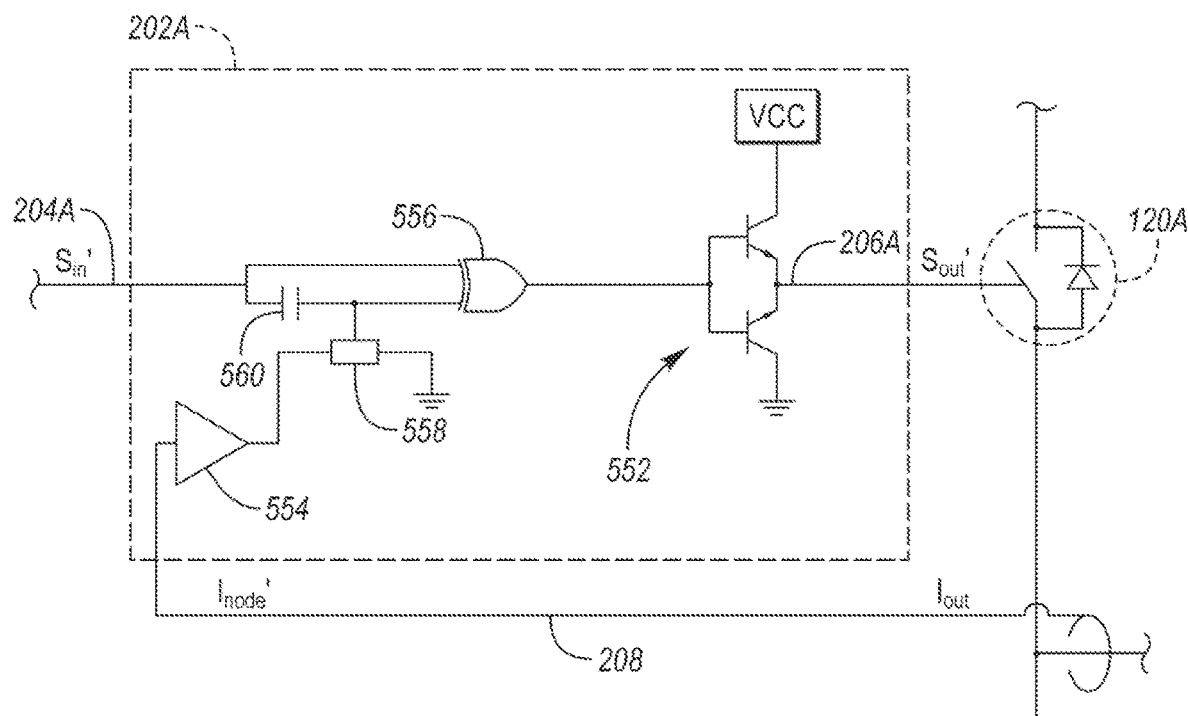
FIG. 5B is a schematic of a gate driver circuit having internal switch feedback.

Referring to FIG. 5B, a schematic of a delay gate driver 202A is shown. Other gate drivers 202b, 252A, 252B may be similarly configured. The gate driver 202A receives an input PWM signal 204A. The gate driver 202A outputs a PWM signal 206A. The output PWM signal 206A drives the switch 120A. The gate driver 202A includes a driver circuit 552. The delay portion of the gate driver 202A is provided via the XOR logic 556 and RC circuit pass filter 558, 560. The logic used in XOR logic 556 may be any other logic implementation (e.g., AND, NAND, NOR) or combination thereof. The logic may be based on the current feedback 208 to ensure proper delay of the PWM signal 204A. For example, if the current feedback 258 and corresponding current feedback 260 are used, the logic portion may correspond to both the current feedback 258 and the corresponding current feedback 260 (not shown). In addition, the proper gain 504, 554 may be either positive or negative depending on the configuration of the circuitry used to delay the PWM signal 204A. The current feedback 208 may be adjusted via the gain operational amplifier 554.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
an electric machine operated by an inverter; and
a gate driver configured to
energize a switch of the inverter with a pulse width modulation (PWM) signal,
detect to a polarity of current of a lead of the electric machine driven by the switch, and
responsive to the polarity being positive, delay the PWM signal by an amount that is a function of a magnitude of the current.

2. The vehicle of claim 1, wherein responsive to the PWM signal being ON, the function is a constant plus a product of the constant and the magnitude.

3. The vehicle of claim 2, wherein the constant is greater than an energization time of the switch.

4. The vehicle of claim 1, wherein responsive to the PWM signal being OFF, the function is a constant less a product of the constant and the magnitude.

5. The vehicle of claim 1, wherein the gate driver is further configured to, responsive to the polarity being negative, delay the PWM signal by an amount that is independent of the magnitude.

6. The vehicle of claim 5, wherein the amount that is independent of the magnitude is a constant.

7. The vehicle of claim 6, wherein the constant is greater than an energization time of the switch.

8. The vehicle of claim 1 further comprising a delay block chip configured to cause the delay.

9. The vehicle of claim 1 further comprising a resistor capacitor circuit configured to cause the delay.

10. A vehicle comprising:
an electric machine operated by an inverter; and
a gate driver configured to
energize a switch of the inverter with a pulse width modulation (PWM) signal,
detect a polarity of current of a lead of the electric machine driven by the switch, and
responsive to the polarity being negative, delay the PWM signal by an amount that is independent of a magnitude of the current.

11. The vehicle of claim 10, wherein the amount is greater than an energization time of the switch.

12. The vehicle of claim 10, wherein the gate driver is further configured to, responsive to the polarity being positive, delay the PWM signal by an amount that is a function of a magnitude of the current.

13. The vehicle of claim 12, wherein responsive to the PWM signal being ON, the function is a constant plus a product of the constant and the magnitude.

14. The vehicle of claim 13, wherein the constant is greater than an energization time of the switch.

15. The vehicle of claim 12, wherein responsive to the PWM signal being OFF, the function is a constant less a product of the constant and the magnitude.

16. The vehicle of claim 15, wherein the constant is greater than an energization time of the switch.

17. A vehicle comprising:
an electric machine operated by an inverter; and
a gate driver configured to energize a switch of the inverter with a pulse width modulation (PWM) signal, and responsive to a polarity of current through the switch being positive and a polarity of current through a corresponding switch being negative, delay the PWM signal by a dependent amount that is a function of a magnitude of the current through the corresponding switch.

18. The vehicle of claim 17, wherein responsive to the PWM signal being ON, the function is a constant plus a product of the constant and the magnitude of the current through the corresponding switch.

19. The vehicle of claim 18, wherein the constant is greater than an energization time of the switch.

20. The vehicle of claim 17, wherein responsive to the PWM signal being OFF, the function is a constant less a product of the constant and the magnitude of the current through the corresponding switch.

* * * * *